United States Patent [19]
Tsukada

[11] Patent Number: 6,151,267
[45] Date of Patent: Nov. 21, 2000

[54] MEMORY DEVICE WITH DECODER HAVING SIMPLIFIED STRUCTURE

[75] Inventor: Shyuichi Tsukada, Tokyo, Japan

[73] Assignee: NEC Corporation, Tokyo, Japan

[21] Appl. No.: 09/364,077

[22] Filed: Jul. 30, 1999

[30] Foreign Application Priority Data

Jul. 30, 1998 [JP] Japan ................................. 10-215788

[51] Int. Cl.⁷ .................................................. G11C 8/00
[52] U.S. Cl. ............................ 365/230.06; 365/230.03
[58] Field of Search .............................. 365/230.06, 203, 365/230.03, 230.08, 207

[56] References Cited

U.S. PATENT DOCUMENTS

| | | | |
|---|---|---|---|
| 5,668,485 | 9/1997 | Rountree | 326/108 |
| 5,970,016 | 10/1999 | Ohsawa | 365/230.03 |
| 6,021,087 | 2/2000 | Bosshart | 365/230.06 |

FOREIGN PATENT DOCUMENTS

| | | |
|---|---|---|
| 62-76824 | 4/1987 | Japan . |
| 4-178027 | 6/1992 | Japan . |
| 7-147087 | 6/1995 | Japan . |

OTHER PUBLICATIONS

Itoh, "*Super LSI Memory*", Nov. 1994, Baihuukan, pp. 152–153 and p. 378.

*Primary Examiner*—David Nelms
*Assistant Examiner*—David Lam
*Attorney, Agent, or Firm*—Young & Thompson

[57] ABSTRACT

A semiconductor memory device include a memory cell plate and a plurality of decoders. The memory cell plate includes a plurality of memory cells arranged in a matrix of rows and columns. Each of the plurality of decoders includes a series connection of at least two MOS transistors. One of two nodes of the series connection is connected to a state signal which is associated with one of the columns, and which is not activated in an active mode. Also, gate control signals are generated by predecoding a part of an address signal and supplied to gates of the at least two MOS transistors, respectively, whereby one of the rows is selected based on a potential of the other node of the series connection. The state signal may be a bit line precharge signal.

22 Claims, 11 Drawing Sheets

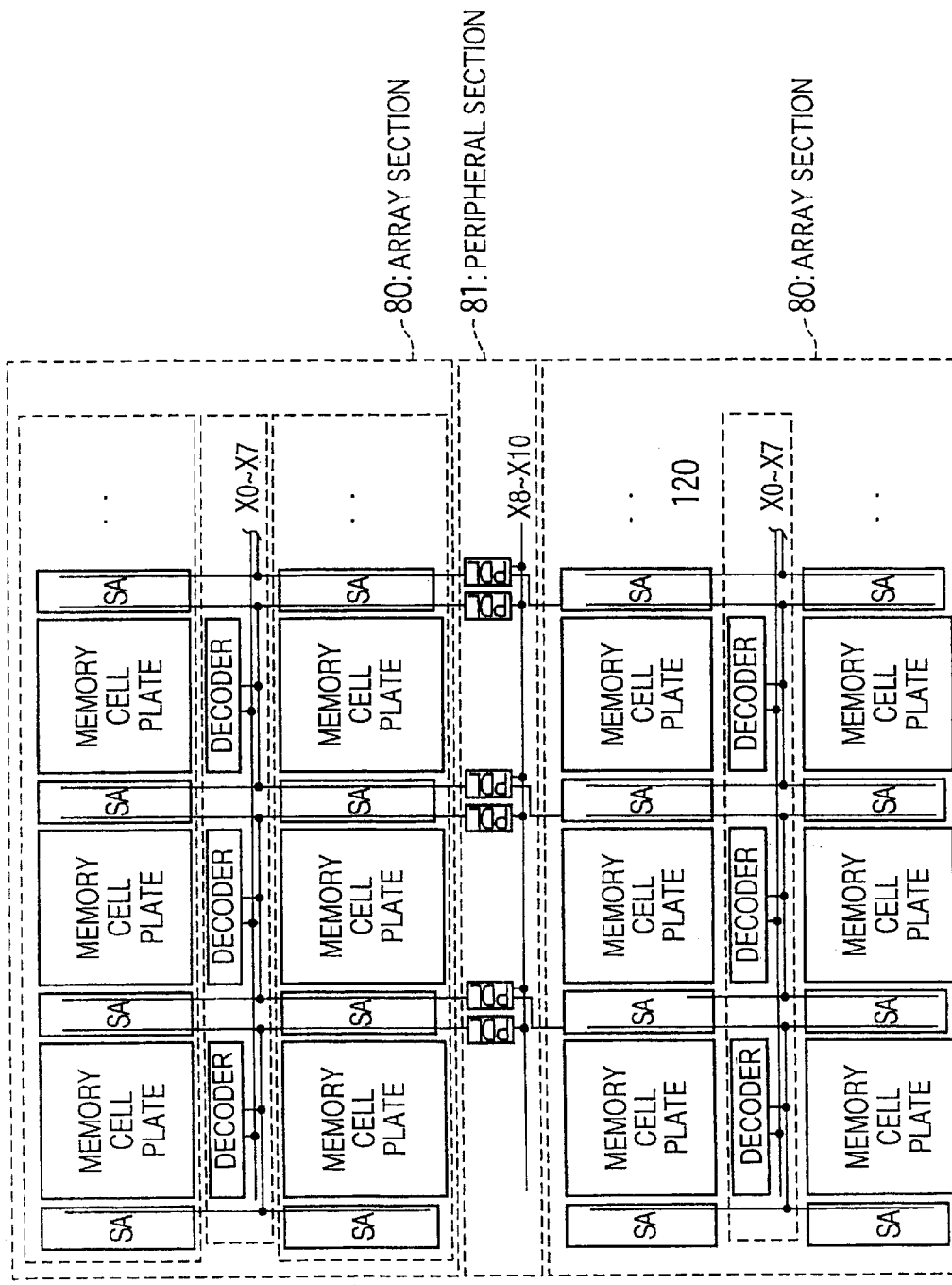

MEMORY DEVICE WITH DECODER HAVING SIMPLIFIED STRUCTURE

BACKGROUND OF THE INVENTION

1. Field of the Invention

The present invention relates to a semiconductor memory device, and more particularly, to a semiconductor memory in which a layout area is reduced.

2. Description of the Related Art

In order to access a memory cell of a semiconductor memory, an address signal to the memory cell is externally supplied and is decoded by a decoder. As a result, a word line and a bit line corresponding to the decoded signal are activated. The decoder needs address signal lines and logic elements for the number of bits of the address signal.

FIG. 1 shows a conventional example of the decoder in a semiconductor memory. The decoder is described in Japanese Laid Open Patent Application (JP-A-Heisei 4-178027). As shown in FIG. 1, in the decoder, a 3-bit address signal is converted into an 8-bit decoded signal. That is, 6 wiring lines for the 3 bits a0, a1 and a2 of the address signal and these inverted bits are supplied to eight 3-input NAND circuits. Thus, the 8-bit decoded signals AA0, AA1, of . . . , AA7 are obtained. The NAND circuit contains 3 N-channel transistors.

Moreover, according to the above reference, in case that the memory is a semiconductor memory, a reset switching circuit must be connected with the NAND circuit.

FIG. 2 is a circuit diagram of the NAND circuit to which the reset switching circuit is connected. As shown in FIG. 2, the NAND circuit contains N-channel transistors TN1, TN2 and TN3, and the reset switching circuit contains P-channel transistors TP3, TP4 and TP5.

FIG. 3 shows a circuit when the above reset switching circuit is simplified. An inverted signal of an address transfer pulse signal ATD is used as a reset signal and is supplied to the reset switch circuits The number of wiring lines and the number of transistors are reduced.

However, with the development of a large capacity of a semiconductor memory, there is a problem in that a ratio of a decoder area and a wiring line area to the whole layout area in the semiconductor memory becomes large if the above conventional decoder is used.

In the above mentioned conventional example, when the number of address bits which are connected to the decoder is 3, 3 transistors are necessary for the 3-input NAND circuit, 2 transistor for the reset switching circuit and 2 transistors for the inverter. Therefore, seven transistors are necessary in the decoder. Thus, a large area is necessary for the layout of the decoder.

Also, for example, in a semiconductor memory using an 11-bit address signal, when first and second bits of the address signal are decoded and the remaining 9 bits of the address signal are decoded for every 3 bits, the number of wiring lines relating to a decoder is 28 (=4+3×8). In this case, the number of wiring lines can be slightly reduced by changing the decoding method. However, it is impossible to largely reduce the number of wiring lines. Therefore, when the number of bits of the address signal increases from 11, to 14 and then to 16, the number of wiring lines also increases with it, so that it is difficult to design the layout of the wiring lines.

Also, for the convenience of layout, a precharge control circuit PDL for generating a bit line precharge signal can not sometimes be arranged in the intersecting position of a sense amplifier SA column and a decoder row. In this case, as shown in FIG. 4, a precharge control circuit PDL is arranged in a peripheral portion 81. However, it is necessary that wiring lines of predecoded signals for all of address bits are arranged for the decoder row. Also, wiring lines for several bits of an address signal are required to be arranged in the peripheral portion 81 for the precharge control circuit PDL in addition to the wiring lines of the predecoded signals. That is, in case of the address signal of 11 bits, if a precharge signal is generated by use of 3 address bits, wiring lines for these 3 bits must be added to the layout. Therefore, the wiring line area further increases.

In conjunction with the above, a decoder circuit is described in Japanese Laid Open Patent application (JP-A-Showa 62-76824). In this reference, the decoder circuit is composed of a plurality of MOS transistors, a first MOS transistor, a second MOS transistor and an inverter circuit. The gates of the plurality of MOS transistors having a first channel type are supplied with different input signal. One off two ends of a current path of each MOS transistor is connected to an output terminal of a decoded signal and the other end is connected to a predetermined potential point in common to the MOS transistors. The first MOS transistor having a second channel type has a current path between a power supply potential and the output terminal and a gate supplied with a precharge control signal. The second MOS transistor having the second channel type is provided such that its current path is connected in parallel to that of the first MOS transistor. The inverter is connected at its input to the output terminal and at its output to the gate of the second MOS transistor.

Also, a semiconductor memory device is described in Japanese Laid Open Patent application (JP-A-Heisei 7-147087). In this reference, A bit line pair (BL, XBL), a precharging circuit (102), a switch circuit (103), a timing control circuit (106) and a sense amplifier (107) are provided for each of a plurality of memory cells (101) connected to a word line (WL) activated by a row decoder (104). The timing control circuit 106 outputs a word line control signal (WC) and a switch control signal (SC) such that the memory cell (101) and a sense amplifier 107 are rapidly disconnected at the time when the potentials of the bit line pair (BL, XBL) change to the degree that the sense amplifier (107) can operate, after the bit line pair (BL, XBL) has been precharged and the word line (WL) is activated. The inactivation of the word line (WL) is controlled by an OR gate (108) and an AND gate (105). Thus, the decrease of bit line potentials is suppressed such that power consumption at the precharging operation of the semiconductor memory can be reduced.

Also, "Super LSI Memory" by Kiyoo ITOH (published from BAIHUUKAN on Nov. 5, 1994) describes a basic circuit of a word driver. FIG. 2.54 shows a repetition unit of the word driver. A decoder is supplied with address signals Xj and Xk obtained by predecoding into 2 bits. The decoder is provided for 4 word lines. The word lines are divided into two groups and the decoder is common to the groups. One decoder is selected and one of the common word lines is selected by use of other two address bits. Thus, a pulse voltage is supplied to corresponding word lines of the groups.

SUMMARY OF THE INVENTION

Therefore, an object of the present invention is to provide a semiconductor memory such as a DRAM which a decoder has a simplified structure and a small area.

Another object of the present invention is to provide a semiconductor memory such as a DRAM in which the number of transistors in a decoder can be reduced, in addition to wiring lines to the decoder.

In order to achieve an aspect of the present invention, a semiconductor memory device include a memory cell plate and a plurality of decoders. The memory cell plate includes a plurality of memory cells arranged in a matrix of rows and columns. Each of the plurality of decoders includes a series connection of at least two MOS transistors. One of two nodes of the series connection is connected to a state signal which is associated with one of the columns, and which is not activated in an active mode. Also, gate control signals are generated by predecoding a part of an address signal and supplied to gates of the at least two MOS transistors, respectively, whereby one of the rows is selected based on a potential of the other node of the series connection. The state signal may be a bit line precharge signal.

Each of the plurality of decoders may further include a first transistor connected between a power supply and the one node of the series connection and is set to an off state in the active mode.

Also, each of the plurality of decoders may further include an inverter connected at its input to the other node of the series connection. In this case, each of the plurality of decoders may further include a second MOS transistor connected between the power supply and the input of the inverter and having a gate connected to an output of the inverter.

Also, each of the plurality of decoders may further include an inverter connected at its input to the other node of the series connection, and a word driving circuit driving a word line related to the selected row. In this case, each of the plurality of decoders may further include a second MOS transistor connected between the power supply and the input of the inverter and having a gate connected to an output of the inverter.

Moreover, the semiconductor memory device may further include a plurality of predecoders decoding sub-parts of the part of the address signal, and supplying the predecoded signals to the gates of the at least two MOS transistors, respectively.

In order to achieve another aspect of the present invention, a dynamic random access memory (DRAM) includes a memory cell plate, a plurality of predecoders, a group of decoders, a precharging section and a sense amplifier section. The memory cell plate includes a plurality of memory cells arranged in a matrix of rows and columns. The plurality of predecoders decodes an address signal to produce predecoded signals. Each of the group of decoders decodes a part of the predecoded signals to select one of the rows of the memory cells of the memory cell plate, and includes a series connection of at least two MOS transistors. One of two nodes of the series connection is connected to a bit line precharge signal which is associated with one of the columns of the memory cells, and which is not activated in an active mode. The decoder part of the predecoded signals is supplied to gates of the at least two MOS transistors, respectively, whereby one of the rows is selected based on a potential of the other node of the series connection. The precharging section precharges bit lines of the columns of the memory cells in each of the plurality of memory cell plates in response to the bit line precharge signal. The sense amplifier section senses data from one of the memory cells which is specified by the selected row of the memory cells.

Each of the decoders may further include a first transistor connected between a power supply and the one node of the series connection and is set to an off state in the active mode.

Also, each of the decoders may further include an inverter connected at its input to the other node of the series connection. In this case, each of the decoders may further include a second MOS transistor connected between the power supply and the input of the inverter and having a gate connected to an output of the inverter.

Also, each of the decoders may further include an inverter connected at its input to the other node of the series connection, and a word driving circuit driving a word line related to the selected row. In this case, each of the decoders may further include a second MOS transistor connected between the power supply and the input of the inverter and having a gate connected to an output of the inverter.

One of the decoders may further include a first transistor connected to a power supply and one node of the series connection of each of the decoders and may be set to an off state in the active mode.

When the DRAM includes a plurality of memory cell plates, the sense amplifier section may be sandwiched by two of the plurality of the memory cell plates and may be a shared sense amplifier section.

Also, in the DRAM, a first row includes a plurality of the memory cell plates, the sense amplifier sections each of which is sandwiched by adjacent two of the plurality of memory cell plates, and a plurality of the precharging sections, a second row includes a plurality of the groups of decoders, a third row includes a plurality of the memory cell plates, the sense amplifier sections each of which is sandwiched by adjacent two of the plurality of memory cell plates, and a plurality of the precharging sections, and a fourth row includes precharge control circuits each of which outputs the bit line precharge signal based on a remaining part of the predecoded signals. In this case, a set of the first to fourth rows may be repeated arranged in this order.

Instead, a first row includes a plurality of the memory cell plates, the sense amplifier sections each of which is sandwiched by adjacent two of the plurality of memory cell plates, and a plurality of the precharging sections, a second row includes a plurality of the groups of decoders, a third row includes a plurality of the memory cell plates, the sense amplifier sections each of which is sandwiched by adjacent two of the plurality of memory cell plates, and a plurality of the precharging sections, and a fourth row includes precharge control circuits each of which outputs the bit line precharge signal based on a remaining part of the predecoded signals. In this case, a set of the first, second, fourth, second and third rows may be repeated 14 arranged.

In order to achieve still another aspect of the present invention, a semiconductor memory device includes a memory cell plate, a plurality of predecoders, a precharge control circuit, a plurality of first decoders, a plurality of second decoders and a plurality of word drivers. The memory cell plate includes a plurality of memory cells arranged in a matrix of rows and columns. The plurality of predecoders decode an address signal to produce a plurality of predecoded signals. The precharge control circuit generates a bit line precharge signal from one of the predecoded signals. Each of the plurality of decoders decodes a part of the plurality of predecoded signals other than the one predecoded signal and the bit line precharge signal to produce a plurality of decoded signals, respectively. The plurality of word drivers are provided for the plurality of decoders, and drive rows of memory cells of the memory cell plate based on a remaining part of the plurality of predecoded signals other than the one predecoded signal and the part of the plurality of predecoded signals and said plurality of decoded signals, respectively.

In this case, each of the plurality of decoders includes a series connection of a plurality of MOS transistors corresponding to the part of the plurality of predecoded signals. Also, the part of the plurality of predecoded signals are supplied to gates of the plurality of MOS transistors, and one of two nodes of the series connection is connected to the bit line precharge signal. Also, each of the plurality of decoders outputs a potential of the other node of the series connection as the decoded signal.

Also, each of the plurality of decoders may decode a part of the plurality of predecoded signals other than the one predecoded signal, the bit line precharge signal and a decoder reset timing signal to produce a plurality of decoded signals, and the decoder reset timing signal is inactive while the memory cell is accessed.

In this case, each of the plurality of decoders includes a control MOS transistor and a series connection of a plurality of MOS transistors corresponding to the part of the plurality of predecoded signals. Also, the part of the plurality of predecoded signals are supplied to gates of the plurality of MOS transistors, and the decoder reset timing signal is supplied to a gate of the control MOS transistor. Also, one of two nodes of the series connection is connected to the bit line precharge signal. Also, each of the plurality of decoders outputs a potential of the other node of the series connection as the first stage decoded signal.

BRIEF DESCRIPTION OF THE DRAWINGS

FIG. 12 is a specific example of the layout of the semiconductor memory of the present invention.

DESCRIPTION OF THE PREFERRED EMBODIMENTS

Hereinafter, a semiconductor memory such as a DRAM of the present invention will be described with reference to the attached drawings.

Figure 1:
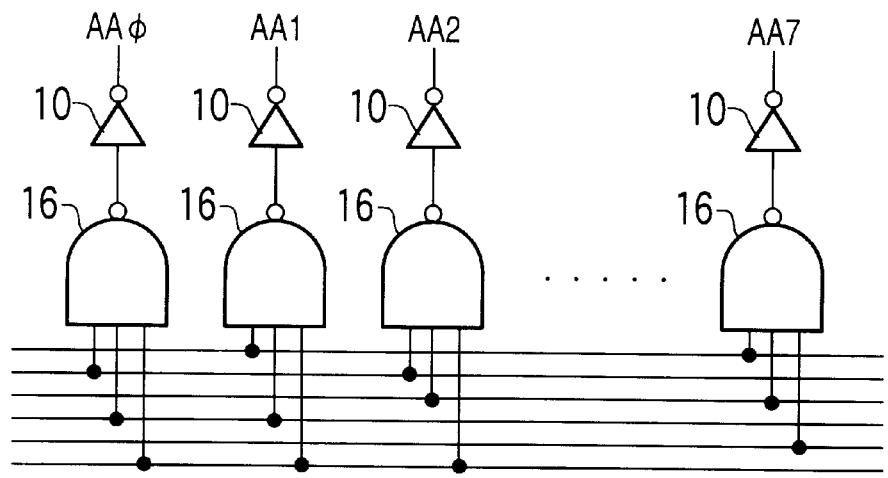
FIG. 1 is a diagram illustrating an address decoder circuit in a conventional example of semiconductor memory.
Figure 2:
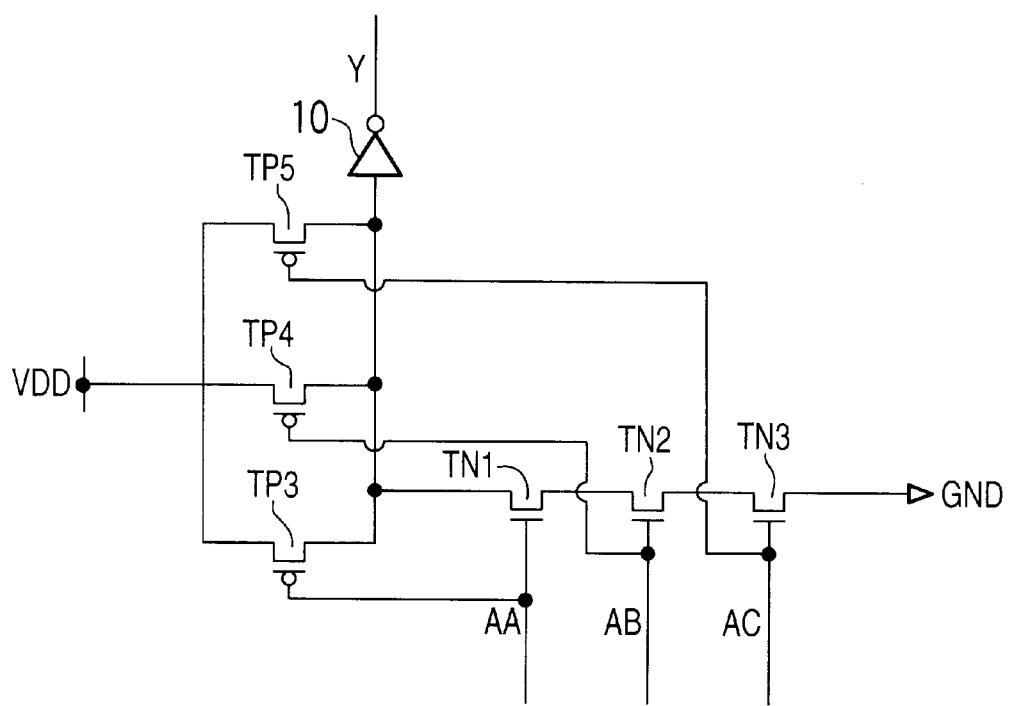
FIG. 2 is a diagram illustrating a decoder in the conventional example of semiconductor memory.
Figure 3:
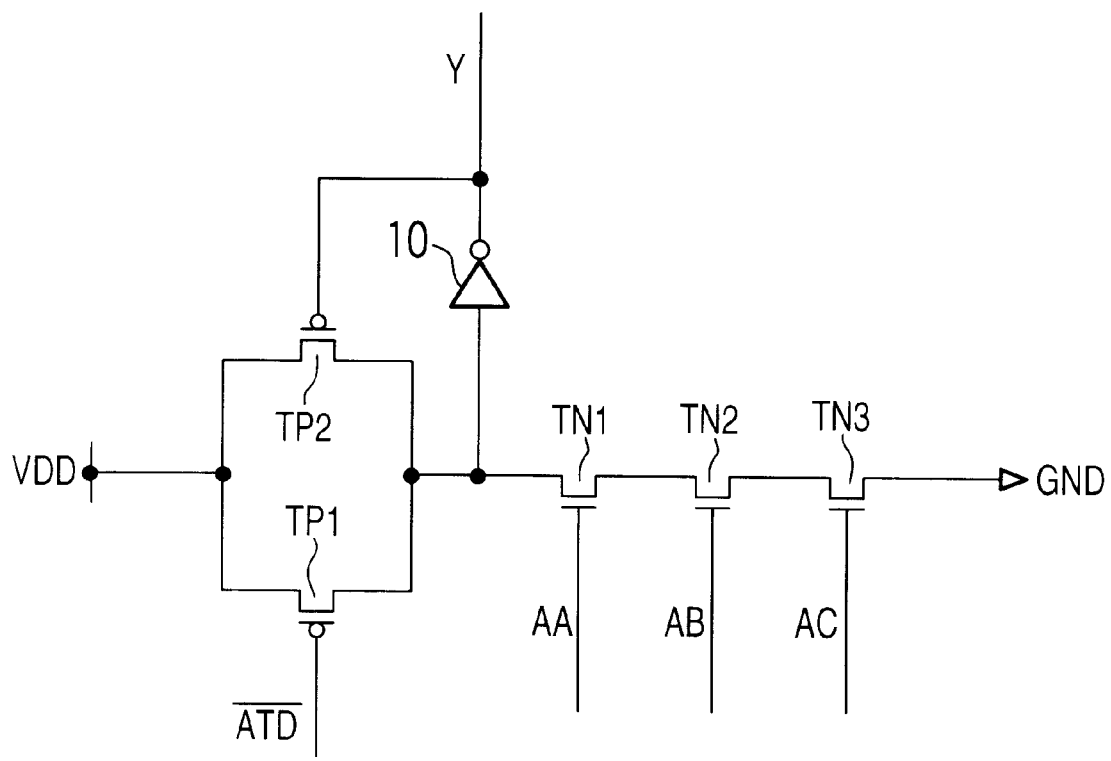
FIG. 3 is a diagram illustrating another decoder in another conventional example of semiconductor memory.
Figure 4:
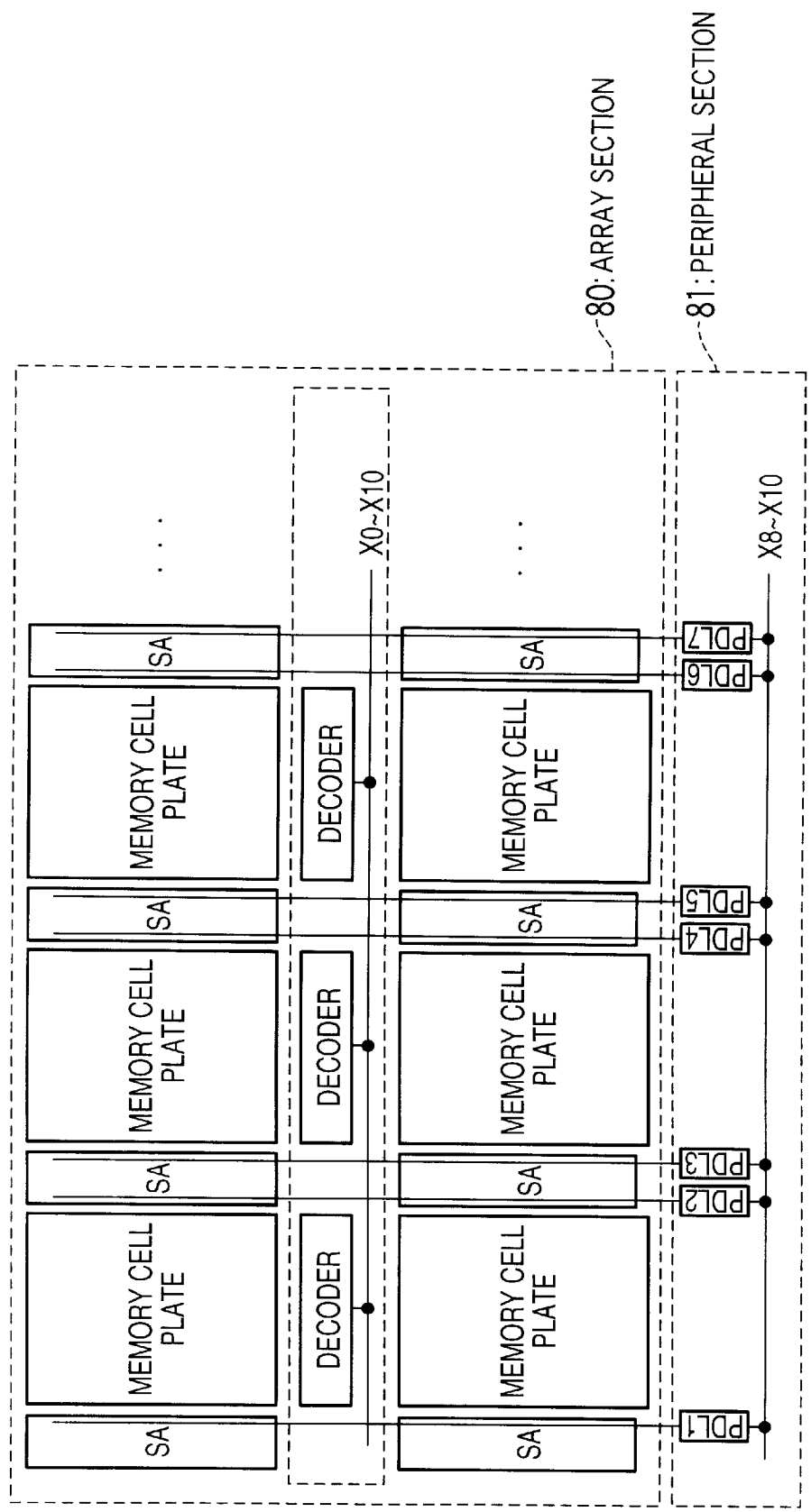
FIG. 4 is a layout diagram of a conventional semiconductor memory.
Figure 5:
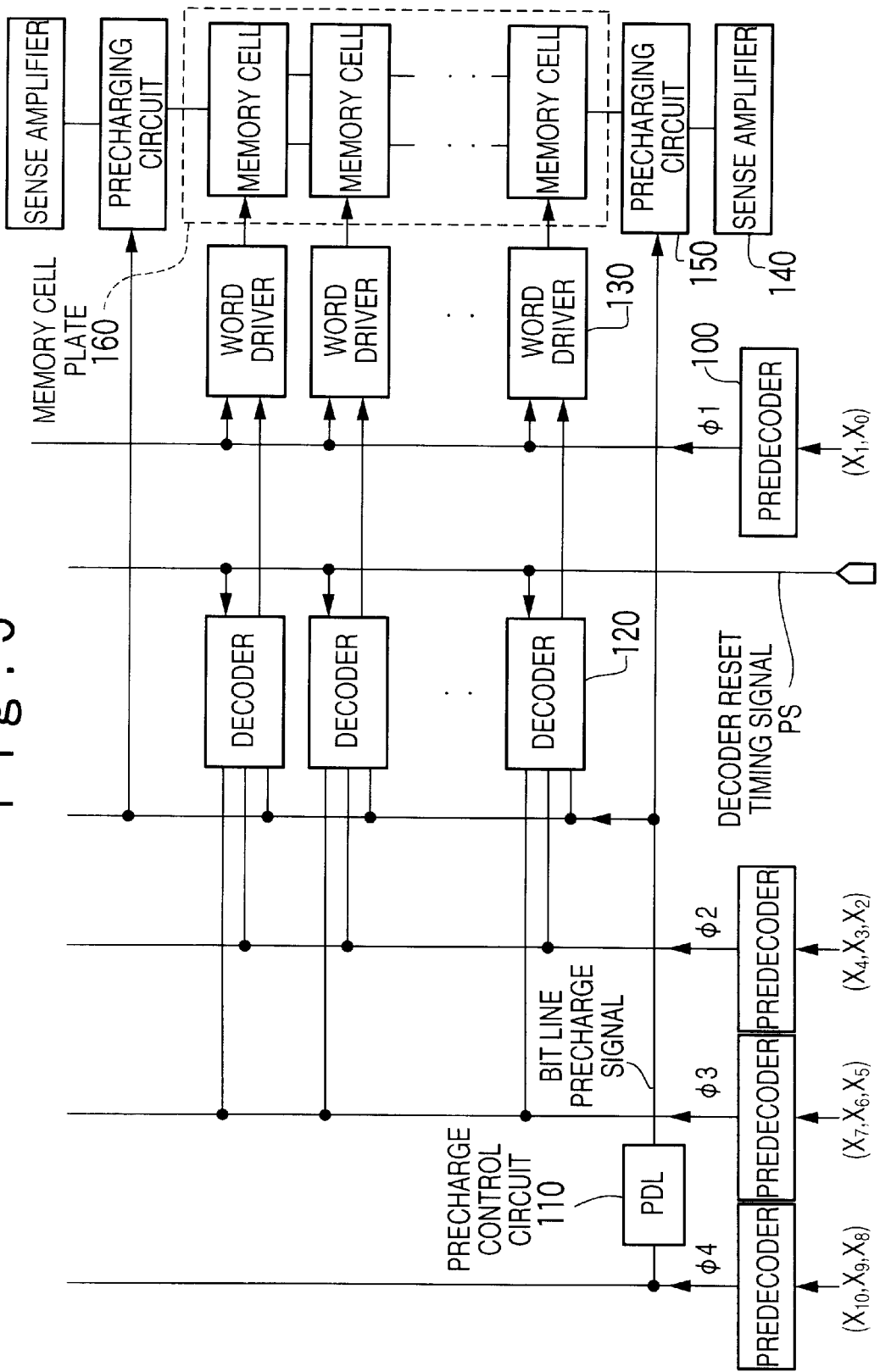
FIG. 5 is a conceptual block diagram of a semiconductor memory of a first embodiment the present invention.
Figure 6:
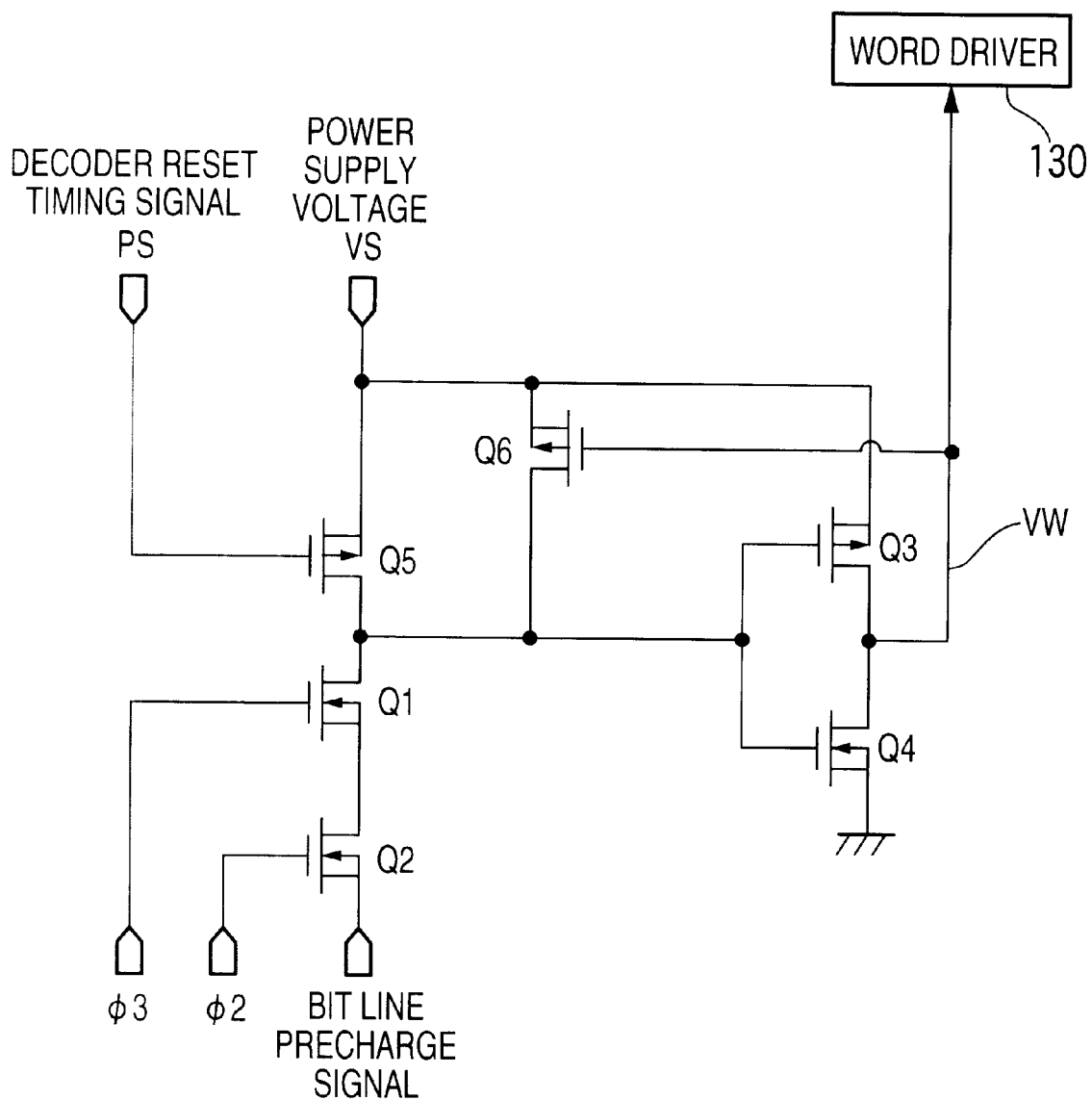
FIG. 6 is a circuit diagram illustrating the structure of a decoder of the present invention.
Figure 7:
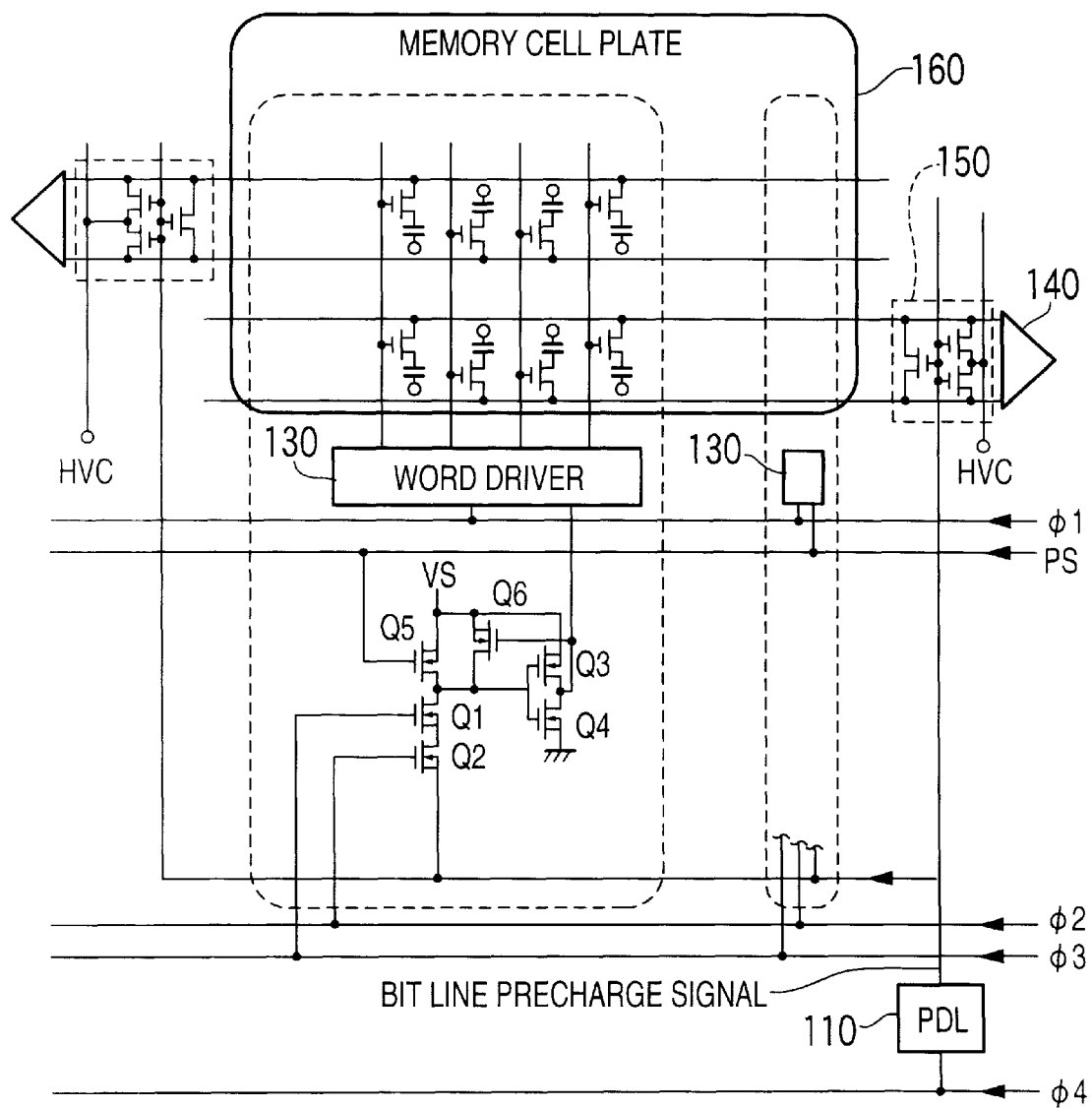
FIG. 7 is a circuit diagram of the semiconductor memory according to a first embodiment of the present invention.

FIG. 5 to FIG. 7 are block diagrams illustrating the structure of the semiconductor memory according to the first embodiment of the present invention. FIG. 5 is the block diagram of the semiconductor memory according to the first embodiment of the present invention.

Referring to FIG. 5, for convenience of description, it is supposed that a row address signal is 11 bits, and the lower bits X0 and X1 of the row address signal are predecoded so that a memory cell is selected.

As shown in FIG. 5, the semiconductor memory in the first embodiment is composed of a memory cell plate 160, precharging circuits 150, a pair of sense amplifiers (SA) 140, a decoding section, predecoders 100, and a precharge control circuit (PDL) 110. The memory cell plate 160 is composed of a plurality of memory cell arranged in a matrix manner. The pair of sense amplifiers (SA) 140 are connected with memory cell plate 160 through the precharging circuits 150. The decoding section is composed of the decoders 120 and the word drivers 130. The predecoder 100 predecodes the address signal of 11 bits.

First, the first predecoder 100 decodes the bits X0 and X1 of the address signal and supplies the predecoded signal ø1 to each word driver 130. Here, the predecoded signal ø1 is 4 bits. Also, the second predecoder 100 predecodes the bits X2, X3 and X4 of the address signal and supplies the predecoded signal ø2 to each decoder 120. Also, the third predecoder 100 predecodes the bits X5, X6 and X7 of the address signal and supplies the predecoded signal ø3 to each decoder 120. Also, the fourth predecoder 100 predecodes the bits X8, X9 and X10 of the address signal, and supplies the predecoded signal ø4 to the precharge control circuit (PDL) 110 with an inverter. The precharge control circuit (PDL) 110 generates a bit line precharge signal from the predecoded signal ø4 and supplies it to the respective decoders 120 and the pair of precharging circuit circuits 150. Here, the predecoded signal ø2, the predecoded signal ø3 and the predecoded signal ø4 are 8 bits, respectively. Each of the 8 bits is supplied to each decoder 120. Also, a decoder reset timing signal PS is supplied to each decoder 120 independently of the address signal.

Therefore, in FIG. 5, the number of decoders 120 is a value selectable based on 6 bits from the bit X2 to the bit X7, i.e., $2^6$ (=64). Also, the word lines of 4 bits obtained by predecoding the 2 bits of X0 and X1 are connected to the word drivers. Therefore, the word lines of 64×4 (=256) are arranged on a single memory cell plate.

Also, in FIG. 5, the number of memory cell plates 160 is a value selectable based on 3 bits from the bit X8 to the bit X10, i.e., $2^3$ (=8).

In the semiconductor memory of the present invention, the structure as one unit shown in FIG. 5 is repeatedly arranged on a semiconductor substrate.

FIG. 6 is a circuit diagram of the above mentioned decoder 120. As shown in FIG. 6, the decoder 120 is composed of a series connection of transistors Q1 and Q2 and a control P-channel transistor Q5, an inverter composed of transistors Q3 and Q4, and the first P-channel transistor Q6.

The control transistor Q5 is connected between a power supply VS and the one end of the series connection, and a bit line precharge signal is supplied to the other end of the series connection. The predecoded signals ø3 and ø2 are supplied to the gates of the N-channel transistors Q1 and Q2, respectively. A decoder reset timing signal PS is supplied to the gate of the second P-channel transistor Q5. The decoder reset timing signal PS is set in response to an active instruction command and is reset in response to a precharge instruction command. Therefore, the decoder reset timing signal PS is active while the memory cell is accessed.

Also, the input terminal of the inverter is connected with the drain of the control P-channel transistor Q5. The output terminal of the inverter is connected with the gate of the first P-channel transistor Q6 for stabilization of the decoder operation. Also, the drain of the first P-channel transistor Q6 is connected with the drain of the second P-channel transistor Q5. The source of the first P-channel transistor Q6 is connected with the power supply VS.

The conventional 3-input NAND circuit is replaced by the series connection of N-channel transistors Q1 and Q2 and the bit line precharge signal. Only two transistors are needed for 3 bit inputs such as the signal ø3, the signal ø2 and the bit line precharge signal. Therefore, the number of transistors is reduced, compared with the conventional 3-input NAND circuit.

Also, the drain of the N-channel transistor Q1 is connected with the input terminal of the inverter so that the word driver 130 is driven in response to the output signal VW of the inverter.

FIG. 7 is a schematic layout diagram of each component of the semiconductor memory according to the first embodiment of the present invention. As shown in FIG. 7, in the semiconductor memory of the present invention, the word line of the memory cell plate 160 is activated in response to predecoded signal ø1, ø2 ø3, and ø4.

Also, the sense amplifier (SA) 140 is connected with a bit line pair through the precharging circuit 150. The sense amplifier (SA) 140 is activated by a sense amplifier activation section (not shown) and amplifies the potential difference of a bit line pair.

In this case, the precharging circuit 150 is composed of three N-channel transistors, and a bit line precharge signal is supplied in common to the gate of each transistor. The precharging circuit 150 short-circuits the bit lines of the pair in response to the bit line precharge signal to charge the bit lines to the precharge voltage of (½)Vcc from a power supply HVC.

Also, the precharge control circuit (PDL) 110 outputs the bit line precharge signal to activate the precharging circuit 150 when the memory cell is not accessed. As the precharge control circuit (PDL) 110, an inverter can be used.

Next, the operation of the semiconductor memory according to the first embodiment of the present invention will be described.

Figure 8:
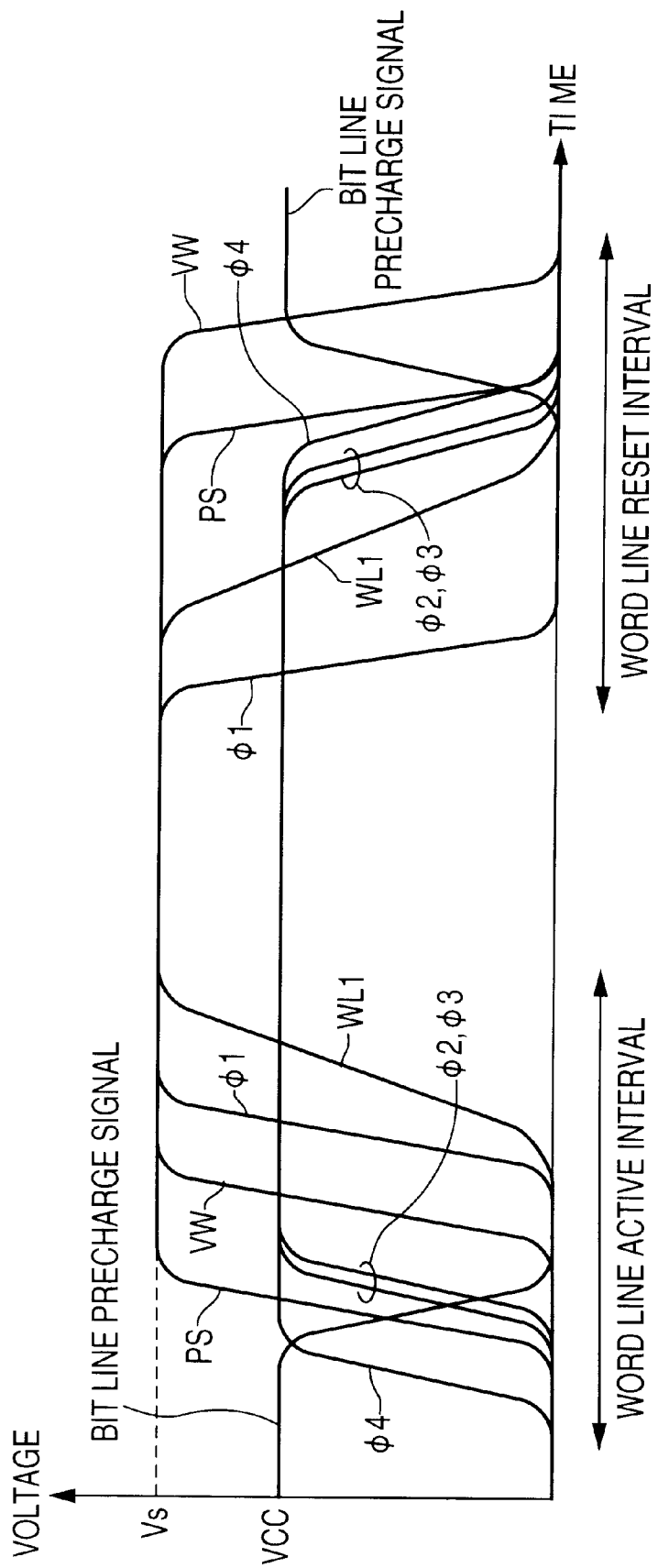
FIG. 8 shows time charts to explain the operation of the semiconductor memory according to the first embodiment of the present invention.

FIG. 8 shows time charts illustrating the elation of the signals in the respective sections of the semiconductor memory according to he first embodiment of the present invention.

First, the case where the word line becomes active will be described.

When the signal ø4 is set to high level, the bit line precharge signal is set to a low level. The precharging circuit 150 is set to a disable state in response to the bit line precharge signal and ends the precharging operation of the bit line.

Also, when the decoder reset timing signal PS is set to a high level, the transistor Q5 is turned off. Also, when the predecoded signals ø2 and ø3 are set to the high level, the transistors Q1 and Q2 are turned on. At this time, the bit line precharge signal is supplied to the series connection of the MOS transistors Q1 and Q2. The inverter composed of the transistors Q3 and Q4 inverts the potential at a node between the transistors Q5 and Q1. As a result, the inverter output VW changes to the high level.

On the other hand, when the predecoded signal ø1 is set to the high level, one of the respective memory cells, e.g., the first word line WL1 in this example is set to an active state.

Next, the case where the word line is reset will be described.

First, when the predecoded signal ø1 changes to the low level, the word line WL1 changes to the low level so that the word line is reset. Also, the signals ø2 and ø3 are set to the low level so that the transistors Q1 and Q2 are turned off. Moreover, when the decoder reset timing signal PS is set to the low level, the transistor Q5 is turned on so that the power supply voltage VS is supplied to the inverter. In this way, the inverter output VW is reset to the low level. Also, when the bit line precharge signal is set to the high level, the precharging operation of the bit line is started.

In FIG. 5, the case where the predecoded signal ø4 is supplied to the precharge control circuit (PDL) 110 is illustrated. Moreover, if the precharge control circuit (PDL) 110 is composed of an inverter, when the predecoded signal ø4 is set to the low level, the bit line precharge signal is set to the high level, so that the precharging operation of the bit lines is started.

However, in the present invention, the bit line precharge signal is supplied to the decoder 120, too. Another signal may be supplied to the precharge control circuit 110 instead of the predecoded signal ø4.

Next, the semiconductor memory according to the second embodiment of the present invention will be described below. In the second embodiment, the semiconductor memory does not need the decoder reset timing signal PS.

Figure 9:
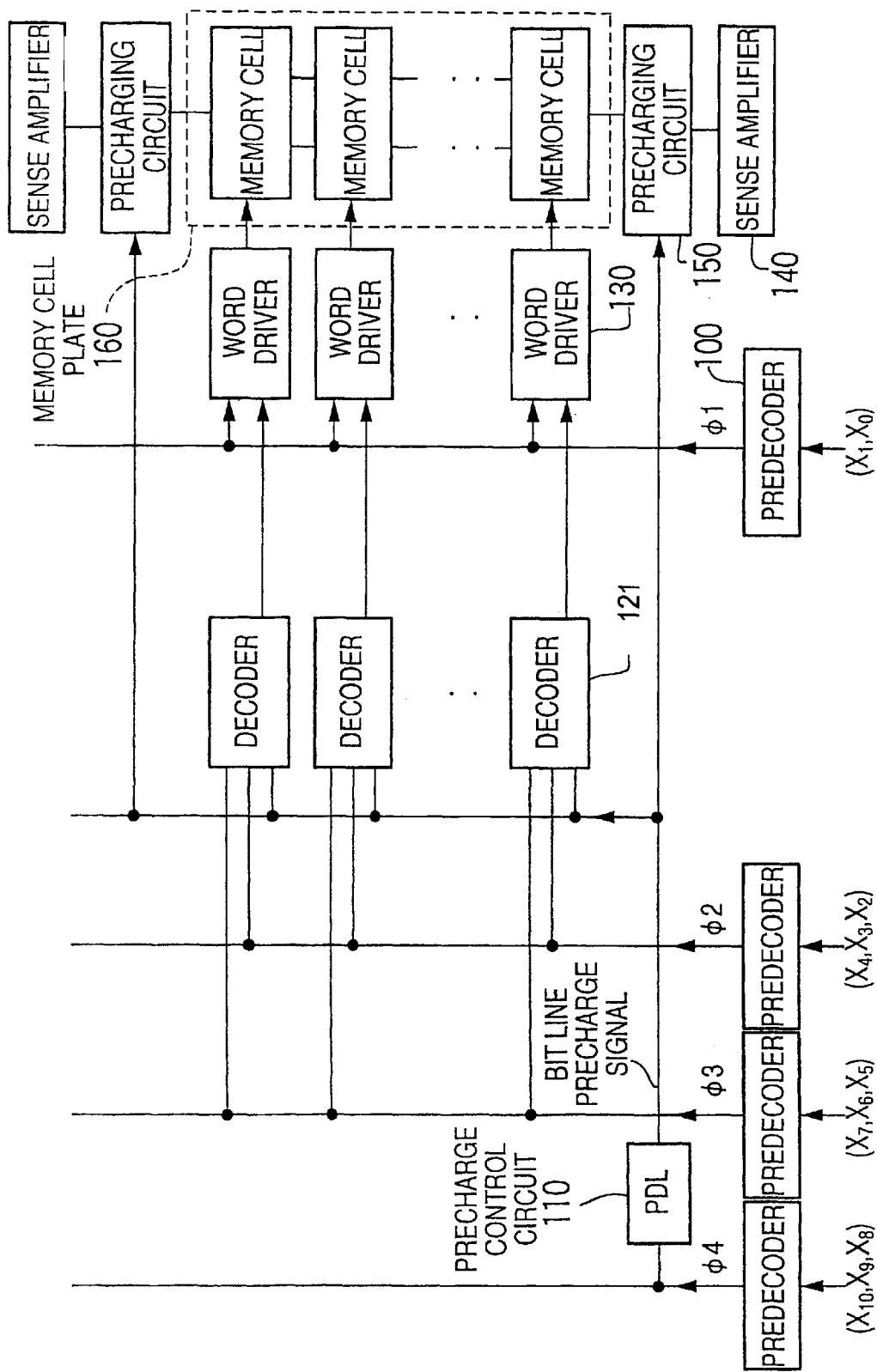
FIG. 9 is a circuit diagram of the semiconductor memory according to a second embodiment of the present invention.

FIG. 9 is a block diagram illustrating the structure of the semiconductor memory according to the second embodiment of the present invention.

In this embodiment, the decoder reset timing signal PS is not supplied to the semiconductor memory circuit. Therefore, the decoder 120 is replaced by a decoder 121.

Figure 10:
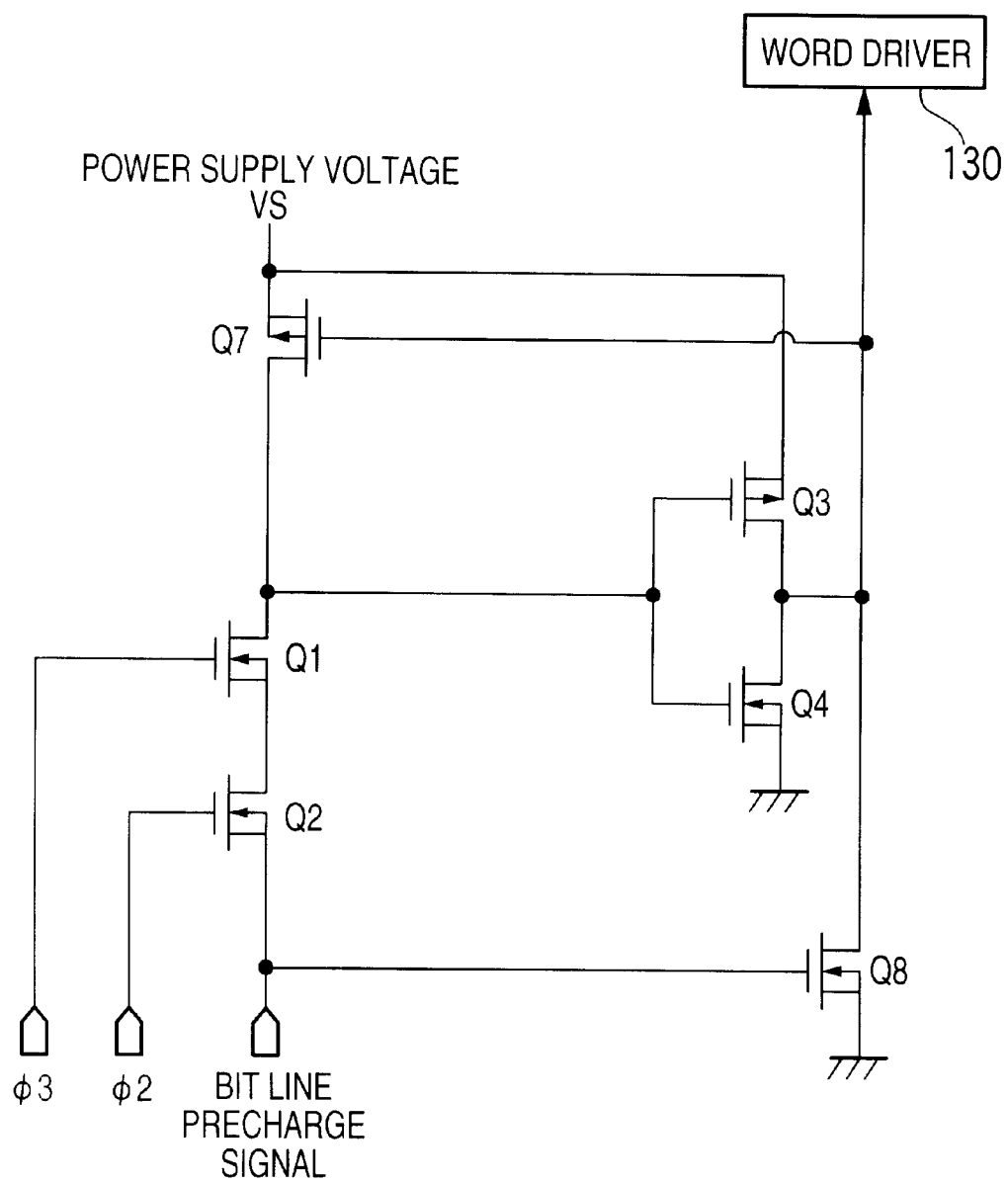
FIG. 10 is a decode for another semiconductor memory of the present invention.

FIG. 10 is a circuit diagram illustrating the structure of the decoder 121. As shown in FIG. 10, the decoder 121 is composed of a series connection of the transistors Q1 and Q2 and a control P-channel MOS transistor Q7, an N-channel transistor Q8, and an inverter composed of the transistors Q3 and Q4. The input terminal of the inverter is connected with the drain of the P-channel transistor Q7. The output terminal of the inverter is connected with the gate of the P-channel transistor Q7. Also, the source of the N-channel transistor Q8 is grounded and the bit line precharge signal is supplied to the gate. The drain is connected with the gate of the P-channel transistor Q7.

Next, the circuit operation of the decoder shown in FIG. 9 will be described. It should be noted that the operation when the word line is active is the same as that of FIG. 5. Therefore, the description is omitted.

As already described above, when the word line is reset, it is necessary to change the inverter output VW from the high level to the low level. For this purpose, the transistor Q8 shown in FIG. 10 is provided.

That is, when the bit line precharge signal is set to the high level, the transistor Q8 is turned on so that the inverter output VW is set to the low level. As a result, the transistor Q7 is turned on so that the power supply voltage VS is supplied to the inverter. Therefore, it is 20 reliably attained that the inverter output is reset to the low level by use of the MOS transistors Q7 and Q8 when the bit line precharge signal is set to the high level.

Next, the semiconductor memory in which the circuit shown in FIG. 5 or FIG. 9 is repeatedly arranged on a semiconductor substrate will be described.

In the present invention, a row of decoders and a row of precharge control circuits are provided. Wiring lines for a part of the predecoded signals are arranged in the row of decoders. Also, wiring lines for all the predecoded signals other than the part are arranged in the row of precharge control circuits. A row in which a sense amplifier and a memory cell plate are alternately arranged, a row of decoders and a row of precharge control circuits are provided.

Figure 11:
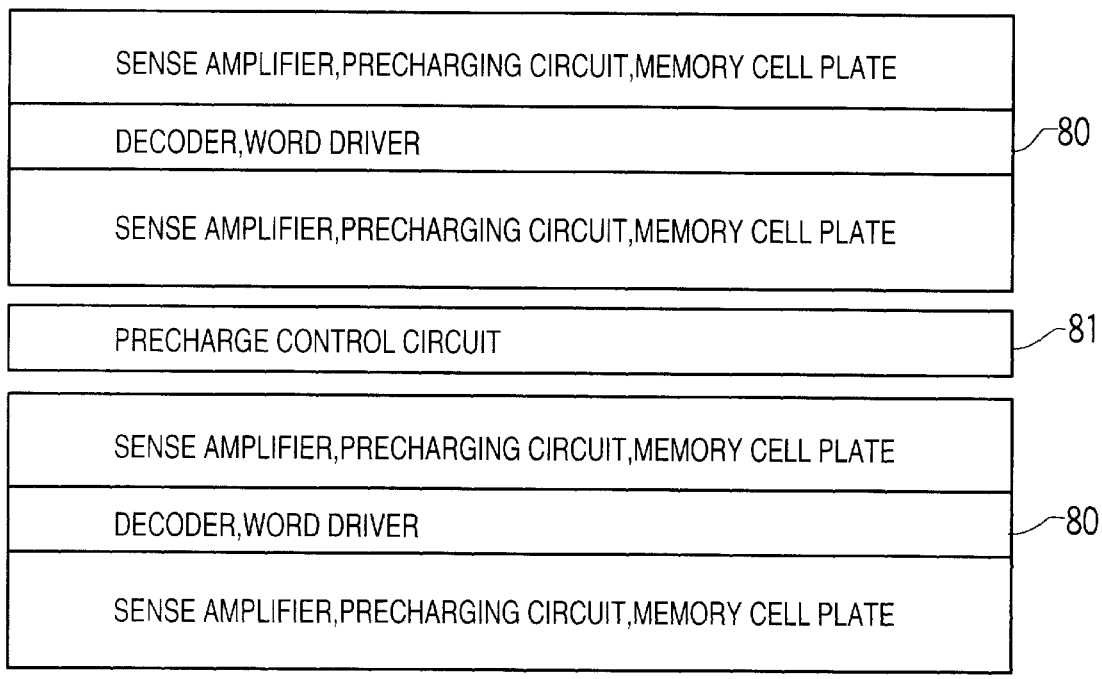
FIG. 11 is a conceptual layout of the semiconductor memory of the present invention.

FIG. 11 shows an example of the layout of the semiconductor memory of the present invention in which the row of decoders and the row of precharge control circuits are separated.

As shown in FIG. 11, in the array section 80, the sense amplifier (SA) 140 and the memory cell plate 160 are alternately arranged in the column direction. Also, the decoder 120 is sandwiched by the memory cell plates 160 in the row direction. In the peripheral portion 81, the precharge control circuits PDL 110 are arranged. It should be noted that the precharging circuit 150 is not illustrated.

In the present invention in which the sense amplifier (SA) 140 and the memory cell plate 160 are alternately arranged, a shared sense amplifier is preferable in which one sense amplifier is shared by the memory cell plates on either side to amplify the potential of the bit line.

FIG. 12 is a diagram illustrating the layout of FIG. 11 in detail. As shown in FIG. 12, in the first row, the sense amplifier (SA) and the memory cell plate are alternately arranged. In the second row, the decoders are arranged as a row. In the third row, the sense amplifier (SA) and the memory cell plate are alternately arranged. In the fourth row, the precharge control circuits are arranged as a row. In the semiconductor memory of the present invention, the first to fourth rows are repeatedly arranged.

That is, a repeat arrangement such as the sense amplifier (SA) 140, the memory cell plate 160, sense amplifier (SA) 140, the memory cell plate 160, . . . is attained in the array section 80. The decoder 120 controls the word lines in the upper and lower memory cell plates 160. The memory cell plate 160 is also sandwiched by the sense amplifiers (SA) 140, and each sense amplifier SA 140 is connected with the precharge control circuit (PDL) 110 for controlling the precharging operation of a bit line pair in the memory cell plate 160. The PDL wiring lines on either side of the memory cell plate 160 are connected with each other by wiring lines which pass by the decoder 120. The precharge control circuit PDL 110 is arranged in the peripheral portion 81. It should be noted that predecoders are arranged on a corner of the array section.

Therefore, the wiring lines for the predecoded signals of the bits from X0 to X7 of the address signal are arranged in the row of the decoders 120 and the wiring lines for the predecoded signals of the bits from X8 to X10 are arranged in the peripheral portion 81. In this case, the wiring lines for the predecoded signals increase but the layout area efficiency is improved because the decoder has a simplified structure.

The layouts of FIG. 11 and FIG. 12 are only for illustration. For example, a row arrangement may be attained such that the first row, the second row, the fourth row, the second row, the third row are repeatedly arranged in this order.

The embodiments were described above. However, the present invention is not limited to the embodiments. The present invention can be accomplished in the scope of the attached claims. For example, the decoders may be connected together. That is, in FIG. 6, the decoders 120 may be connected to the source of the N-channel transistor Q2, and the common node may be connected to the single N-channel transistor Q1.

Also, the word driver 130 is not provided and the word line may be directly driven by the decoder 120.

As described above, according to the present invention, the bit line precharge signal is used for the control of the decoder, in addition to the precharging operation. Therefore, the number of transistors of a circuit can be reduced and the decoder can be made small in size.

Also, according to the present invention, the number of predecoded signal wiring lines and the number of decoder reset timing signal wiring lines can be reduced. Therefore, the wiring line layout area can be reduced.

What is claimed is:

1. A semiconductor memory device comprising:
   a memory cell plate including a plurality of memory cells arranged in a matrix of rows and columns;
   a precharging circuit connected between a first memory cell of said plurality of memory cells and a sense amplifier to precharge a bit line of said memory cell;
   a plurality of decoders, each of which includes a series connection of at least two MOS transistors,
   wherein a first node of said series connection is connected to a state signal which is associated with one of said columns, and which is not activated in an active mode, and
   wherein gate control signals derived from a predecoded part of an address signal are supplied to gates of said at least two MOS transistors, respectively, to select a row of said matrix of rows based on a potential of a second node of said series connection.

2. A semiconductor memory device according to claim 1, wherein said state signal is a bit line precharge signal.

3. A semiconductor memory device according to claim 1, wherein each of said plurality of decoders further includes a first transistor coupled between a power supply and said first node of said series connection and is set to an off state in the active mode.

4. A semiconductor memory device according to claim 1, wherein each of said plurality of decoders further includes an inverter connected at an input to said second node of said series connection.

5. A semiconductor memory device according to claim 4, wherein each of said plurality of decoders further includes a second MOS transistor connected between a power supply and said input of said inverter and having a gate connected to an output of said inverter.

6. A semiconductor memory device according to claim 1, wherein each of said plurality of decoders further includes:
   an inverter connected at an input to said second node of said series connection; and
   a word driving circuit driving a word line related to said selected row.

7. A semiconductor memory device according to claim 6, wherein each of said plurality of decoders further includes a third MOS transistor connected between a power supply and said input of said inverter and having a gate connected to an output of said inverter.

8. A semiconductor memory device according to claim 1, wherein said gate control signals of said at least two MOS transistors are provided by a plurality of predecoders decoding sub-parts of said part of said address signal.

9. A dynamic random access memory (DRAM) comprising:
   a memory cell plate, which includes a plurality of memory cells arranged in a matrix of rows and columns;
   a plurality of predecoders decoding an address signal to produce predecoded signals;
   a group of decoders, each of which decodes a part of said predecoded signals to select one of said rows of said memory cells of said memory cell plate, wherein each of said decoders includes a series connection of at least two MOS transistors, wherein one of two nodes of said series connection is connected to a bit line precharge signal which is associated with one of said columns of said memory cells, and which is not activated in an active mode, wherein said part of said predecoded signals is supplied to gates of said at least two MOS transistors, respectively, whereby one of said rows is selected based on a potential of the other node of said series connection;

a precharging section precharging bit lines of said columns of said memory cells in each of said plurality of memory cell plates in response to said bit line precharge signal; and a sense amplifier section, wherein said sense amplifier section senses a data from one of said memory cells which is specified by said selected row of said memory cells.

10. A DRAM according to claim 9, wherein each of said decoders further includes a first transistor connected between a power supply and said one node of said series connection and is set to an off state in the active mode.

11. A DRAM according to claim 9, wherein each of said decoders further includes:

an inverter connected at its input to said other node of said series connection.

12. A DRAM according to claim 11, wherein each of said decoders further includes:

a second MOS transistor connected between said power supply and said input of said inverter and having a gate connected to an output of said inverter.

13. A DRAM according to claim 9, wherein each of said decoders further includes:

an inverter connected at its input to said other node of said series connection; and a word driving circuit driving a word line related to said selected row.

14. A DRAM according to claim 13, wherein each of said decoders further includes:

a second MOS transistor connected between said power supply and said input of said inverter and having a gate connected to an output of said inverter.

15. A DRAM according to claim 9, wherein one of said decoders further includes a first transistor connected to a power supply and said one node of said series connection of each of said decoders and is set to an off state in the active mode.

16. A DRAM according to claim 9, wherein said DRAM includes a plurality of said memory cell plates, and said sense amplifier section is sandwiched by two of said plurality of said memory cell plates and is a shared sense amplifier section.

17. A DRAM according to claim 9, wherein a first row includes a plurality of said memory cell plates, said sense amplifier sections each of which is sandwiched by adjacent two of said plurality of memory cell plates, and a plurality of said precharging sections, a second row includes a plurality of said groups of decoders, a third row includes a plurality of said memory cell plates, said sense amplifier sections each of which is sandwiched by adjacent two of said plurality of memory cell plates, and a plurality of said precharging sections, a fourth row includes precharge control circuits each of which outputs said bit line precharge signal based on a remaining part of said predecoded signals, and wherein a set of said first to fourth rows is repeated arranged in this order.

18. A DRAM according to claim 9, wherein a first row includes a plurality of said memory cell plates, said sense amplifier sections each of which is sandwiched by adjacent two of said plurality of memory cell plates, and a plurality of said precharging sections, a second row includes a plurality of said groups of decoders, a third row includes a plurality of said memory cell plates, said sense amplifier sections each of which is sandwiched by adjacent two of said plurality of memory cell plates, and a plurality of said precharging sections, a fourth row includes precharge control circuits each of which outputs said bit line precharge signal based on a remaining part of said predecoded signals, and wherein a set of said first, second, fourth, second and third rows is repeated arranged.

19. A semiconductor memory device comprising:

a memory cell plate including a plurality of memory cells arranged in a matrix of rows and columns;

a plurality of predecoders decoding an address signal to produce a plurality of predecoded signals;

a precharge control circuit generating a bit line precharge signal from one of said predecoded signals;

a plurality of decoders, each of which decodes a part of said plurality of predecoded signals other than said one predecoded signal and said bit line precharge signal to produce a plurality of decoded signals;

a plurality of word drivers provided for said plurality of decoders, and driving rows of memory cells of said memory cell plate based on a remaining part of said plurality of predecoded signals other than said one predecoded signal and said part of said plurality of predecoded signals and said plurality of decoded signals, respectively.

20. A semiconductor memory device according to claim 19, wherein each of said plurality of decoders includes a series connection of a plurality of MOS transistors corresponding to said part of said plurality of predecoded signals, wherein said part of said plurality of predecoded signals are supplied to gates of said plurality of MOS transistors, wherein one of two nodes of said series connection is connected to said bit line precharge signal, and wherein each of said plurality of decoders outputs a potential of the other node of said series connection as said decoded signal.

21. A semiconductor memory device according to claim 19, wherein each of said plurality of decoders decodes a part of said plurality of predecoded signals other than said one predecoded signal, said bit line precharge signal and a decoder reset timing signal to produce a plurality of decoded signals, said decoder reset timing signal being inactive while said memory cell is accessed.

22. A semiconductor memory device according to claim 21, wherein each of said plurality of decoders includes a control MOS transistor and a series connection of a plurality of MOS transistors corresponding to said part of said plurality of predecoded signals, wherein said part of said plurality of predecoded signals are supplied to gates of said plurality of MOS transistors, and said decoder reset timing signal is supplied to a gate of said control MOS transistor, wherein one of two nodes of said series connection is connected to said bit line precharge signal, and wherein each of said plurality of decoders outputs a potential of the other node of said series connection as said decoded signal.

* * * * *